United States Patent [19]

Bromfield et al.

[11] 4,007,988
[45] Feb. 15, 1977

[54] MANUFACTURE OF MULTI-LAYER STRUCTURES

[75] Inventors: Ian Derek Bromfield, Leicester; Peter Seddon, Wigan, both of England

[73] Assignee: Nippon Kogaku K.K., Tokyo, Japan

[22] Filed: May 3, 1974

[21] Appl. No.: 466,914

[30] Foreign Application Priority Data

May 3, 1973 United Kingdom ............ 21073/73

[52] U.S. Cl. ............................................. 355/133
[51] Int. Cl.² ......................................... G03B 27/00
[58] Field of Search ............ 355/40, 52, 79, 78, 355/133; 33/184.5; 96/36.2, 41

[56] References Cited

UNITED STATES PATENTS

| | | | |
|---|---|---|---|
| 3,264,106 | 8/1966 | Alldis | 355/79 |
| 3,299,777 | 1/1967 | Hunstiger | 355/52 |
| 3,490,846 | 1/1970 | Kasper | 355/78 |
| 3,742,229 | 6/1973 | Smith et al. | 96/36.2 UX |
| 3,771,868 | 11/1973 | Bassereau | 355/40 |
| 3,782,942 | 1/1974 | Compare | 96/41 |

*Primary Examiner*—John Gonzales
*Attorney, Agent, or Firm*—Fitzpatrick, Cella, Harper & Scinto

[57] ABSTRACT

In the alignment of successive masks relative to a photo-sensitive substrate in the manufacture of multi-layers respective fiducial marks on the substrate and on each mask are brought into the correct relative position for exposure of the substrate, without introducing the inaccuracy resulting from the superimposition of successive photographic images of the mask fiducial marks on the substrate. In one method the mask and substrate fiducial marks are arranged to be out of register with each other when the mask and substrate are correctly aligned, the two sets of fiducial marks being brought into register by an optical beam displacing arrangement. In alternative process the substrate fiducial marks are exposed separately from the main exposure of the remainder of the substrate before or after alignment of the substrate with the mask, or, in the case of a positive photo-resist, the substrate fiducial marks are separately masked during the exposures of the substrate after alignment thereof with each successive printing mask.

4 Claims, 6 Drawing Figures

MANUFACTURE OF MULTI-LAYER STRUCTURES

FIELD OF THE INVENTION

The present invention relates to the manufacture of multi-layer structures. More particularly the invention is concerned with the problem of providing stable and accurate alignment of fiducial marks on a surface to be printed in a series of photo-graphic processes with corresponding fiducial marks on a succession of masks for each process. This problem arises whether the alignment is effected automatically or manually.

BACKGROUND OF THE INVENTION

Each photographic printing process entails the coating of the substrate surface with photo-resist, which is usually of the negative type, exposing the surface through an interposed mask, and developing the exposed surface. The developed surface may be subjected to a number of different further treatments, such as etching, diffusion and aluminising. By control and selection of the mask patterns and processes a complex structure of layers may be built up. It is essential that the patterns reproduced on the surface at each exposure are in precise spatial relation to each other, and for this reason the mask used in each exposure of the surface must be precisely aligned with respect to previously produced patterns on the surface. It is for the purpose of achieving such precise alignment that fiducial marks are printed upon the surface and on the masks.

In one known method of aligning fiducial marks used hitherto, two fiducial marks are first printed upon the surface of a substrate such as a wafer which is to receive a complex structure of layers. The two fiducial marks are separated by a pre-determined distance which is usually comparable to the width of the wafer so that alignment to these marks necessarily causes alignment over the wafer as a whole. Each mark is basically in the form of a simple cross and the two marks are parallel to each other. Further fiducial marks, in the form of two crosses, separated by the same distance as those on the wafer, are provided on each of the masks with which the wafer is to be successively aligned. Alignment of the two wafer marks and the corresponding mask marks is achieved by automatically positioning the crosses of the wafer relative to those of each mask within the dimensions of uniform or blank regions surrounding the crosses using mechanical means and then using servomotors to effect further automatic positioning of the mask so that its fiducial crosses coincide with those of the wafer. Error signals to drive the servomotors are derived photoelectrically from optical scans of corresponding lines of respective mask and wafer crosses, a zero signal being provided at coincidence of the mask and wafer crosses. The regions surrounding the fiducial marks must be uniformly blank for automatic alignment since signals resulting from the optical scan can only be interpreted when no appreciable interfering mark falls within the scan.

After automatic alignment with the mask the wafer is exposed photographically to reproduce on the wafer the pattern of the mask. A problem which has existed hitherto is that at each exposure a further printing of the fiducial marks of the mask, such as the cross referred to above, is superimposed on the original mark on the wafer until several photographic images are superimposed on the wafer marks. The superimposed photographic prints inevitably give rise to spurious variations in the definition of the fiducial marks as regards width, shading and general contrast level, which result in some inaccuracy in the zero indication of the scanner. This inaccuracy increases as the number of superimpositions increases.

A known method of overcoming this problem is to use a different set of fiducial marks for each exposure. Each mask then reproduces photographically its particular set of fiducial marks, so that previous overprinted wafer fiducial marks are not used. The wafer itself is provided with fiducial marks unaffected by overprinting to permit accurate alignment of each successive mask. The set of wafer fiducial marks used corresponds to the set particular to each mask. Unfortunately, as has been explained above, for the purpose of automatic alignment there must necessarily be an isolating blank region around each fiducial mark to make photo-electric recognition feasible, and with multiple sets of wafer marks this entails a consequential loss in the effective usable area of the wafer. The lost area depends on the number of masking processes used and the expected variation in the initial mechanical positioning. This known method is applicable to manual alignment where recognition of close-spaced patterns through a microscope is feasible.

SUMMARY OF THE INVENTION

According to the present invention there is provided a method of aligning a succession of masks relative to a substrate in the manufacture of a multilayer structure by subjecting a substrate to a series of operations including photographic exposures of selected areas utilising a succession of masks which are each brought into a desired spatial relationship to the substrate, in which each successive mask is correctly positioned relative to the substrate by making use of fiducial marks on each successive mask which are brought into a predetermined relationship with the same set of fiducial marks on the substrate without the superimposition on the latter of any photographic images of the fiducial marks on the masks.

The method of the invention enables an original single set of fiducial marks printed on a substrate surface in an initial print process to be used as a reference for subsequent alignments relative to the surface of a succession of masks in further interleaved printing processes, the method being such that over-printing of the original single set of fiducial marks by photographic printing of fiducial marks on the masks is avoided and the conditions of recognition repeated during each of a series of mask-substrate alignments. The invention therefore meets the objective of providing precise alignments without using numerous dispersed sets of marks. Moreover, if error is present in the registration of fiducial marks on a mask, the error caused thereby to wafer alignment is now consistent and correction is practicable.

In a preferred method according to the invention the fiducial marks on the substrate and each mask are brought separately into registration with two separate locations which differ by pre-determined and precisely known co-ordinates.

The fiducial marks on the substrate may each for example be of a basic cross form and may first be aligned with a third reference of a similar cross form located within a scanner device. In a second alignment operation a similar pair of fiducial marks on a mask are aligned with the same reference, or with a further reference spaced from the said third reference by a predetermined distance.

In a preferred embodiment the fiducial marks on the substrate and the corresponding fiducial marks on each mask are offset relatively to each other by a predetermined amount when the mask and substrate are in the correct relative positions. For example, the fiducial marks on the substrate may be illuminated through the mask, the fiducial marks on the mask being out of the path of the light illuminating the substrate marks, and images of the respective fiducial marks formed by light reflected therefrom being observed or detected, the substrate and mask being brought into the correct relative positions by bringing the respective images into predetermined relative positions. The light reflected from either the mask or the substrate fiducial marks preferably passes through an adjustable beam displacing means which is adjusted by a specific amount to bring the images of the respective fiducial marks into coincidence with each other.

In an alternative preferred embodiment of the invention applicable particularly to the exposure of negative photo-resists, the substrate is exposed photographically through a succession of masks and before or after each main exposure at least two fiducial marks on the substrate, and respective uniform background regions surrounding said marks, are exposed separately from the main exposure of the remainder of the substrate before or after being brought into alignment with respective fiducial marks on each successive mask. Alternatively, when exposing a positive photo-resist, the substrate may be subjected to a succession of exposures through a succession of masks, the fiducial marks on the substrate being separately masked during said exposures after being brought into alignment with the respective fiducial marks on each mask.

The present invention also comprehends an apparatus for use in positioning a succession of masks relative to a photo-sensitive substrate for the manufacture of a multi-layer structure by a series of photographic exposures, the substrate and each mask bearing respective fiducial marks which are utilised in such positioning, the apparatus comprising means directing light on to the substrate fiducial marks through the mask, means for directing light reflected from the said substrate marks to a reference location, means for directing light reflected from the mask fiducial marks to a reference location, which is the same as or separate from the aforesaid reference location, and means for adjusting the position of each mask relative to the substrate to bring the mask and substrate into a desired relative position for exposure while the fiducial marks on the mask and substrate are out of register, means for monitoring said relative position at the or each said reference location.

In one embodiment the substrate and mask fiducial marks are relatively offset and are illuminated by light directed by the same optical system, the means for directing reflected light from the mask and substrate fiducial marks to the said reference location or locations comprising at least part of said optical system, and a beam splitter being included in said optical system to separate the illuminating beam from the reflected beams. Preferably adjustable beam displacing means are located in the reflected beam from either the mask or the substrate fiducial marks so that, when the mask and substrate are correctly positioned relative to each other the two reflected beams form successive images of the respective fiducial marks in register at the same reference location. The said beam displacing means may comprise a light-transmitting plate with parallel faces arranged for rotation about an axis parallel to said faces and perpendicular to the beam to be displaced.

In a practical embodiment of the apparatus an oscillatory apertured stop is provided at the or each reference location for oscillatory movement perpendicularly to the reflected beam incident thereon, the mean or rest position of the apertured stop coinciding with the position of the said beam when the respective fiducial mark is correctly positioned, and phase-sensitive photoelectric detector means responsive to light transmitted through said apertured stop to indicate departure of the said beam from the said mean or rest position.

An alternative embodiment of the apparatus according to the invention comprises means for exposing only the fiducial marks of the substrate and immediately surrounding regions prior to or after alignment of the said marks with fiducial marks on each successive mask, so that upon exposure of the remainder of the substrate through each mask no photographic images of the mask fiducial marks are formed on the substrate. The substrate is preferably supported by a movable chuck device for movement relative to a mask support, the chuck device having apertures provided with light guiding means through which only the fiducial marks and said surrounding regions of the substrate are exposed.

The said light guiding means may comprise respective tubular sleeves inserted in said apertures and adjustable in position therein for exposure of the substrate fiducial marks and surrounding regions.

BRIEF DESCRIPTION OF THE DRAWINGS

The invention will now be described, by way of example only, with reference to the accompanying diagrammatic drawings, in which.

DESCRIPTION OF PREFERRED EMBODIMENTS

Figure 1:
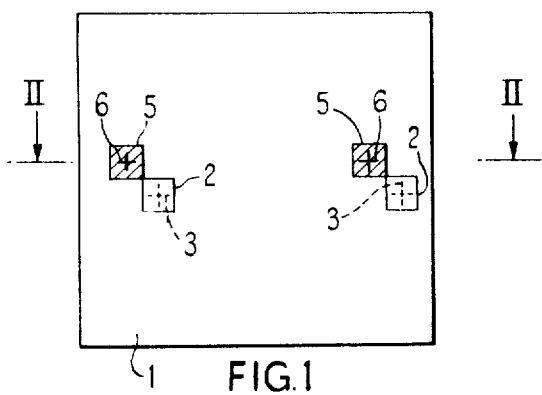
FIG. 1 is a plan view of a substrate and superposed mask for carrying out a method according to a first embodiment of the invention.
Figure 2:
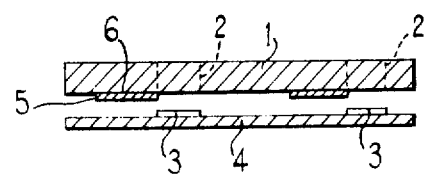
FIG. 2 is a diagrammatic cross-sectional view on line II—II of FIG. 1.

FIG. 1 is a diagrammatic plan view showing a transparent glass mask 1, through transparent areas 2 of which a blank uniform zone around each of two fiducial marks 3 in the form of crosses on a wafer substrate 4 (see FIG. 2) may be illuminated. The sectional view of FIG. 2 shows the relative positions of mask 1 and substrate 4 when light is being transmitted through the mask 1 to be incident on the fiducial marks 3 of the wafer substrate 4. Brightly reflecting areas 5 are provided around each of two similar fiducial marks 6 on the mask 1. The areas 5 are made brightly reflecting by the deposition of a thick background layer of chromium on the underside of the mask 1. The mask marks 6, also in the form of crosses, comprise comparatively thin emulsion layers which are deposited on the mask 1 before the layers forming the reflecting areas 5, thereby forming for each mark 6 a dark cross strongly contrasting with a light background. No light can penetrate through the chromium reflecting layers of the areas 5 to affect the substrate lying behind it.

When the substrate 4 and mask 1 are in the correct relative positions for an exposure the substrate marks 3 are spaced laterally by a predetermined distance from the mask marks 6 and reflective background areas 5, as shown in FIGS. 1 and 2.

Figure 3:
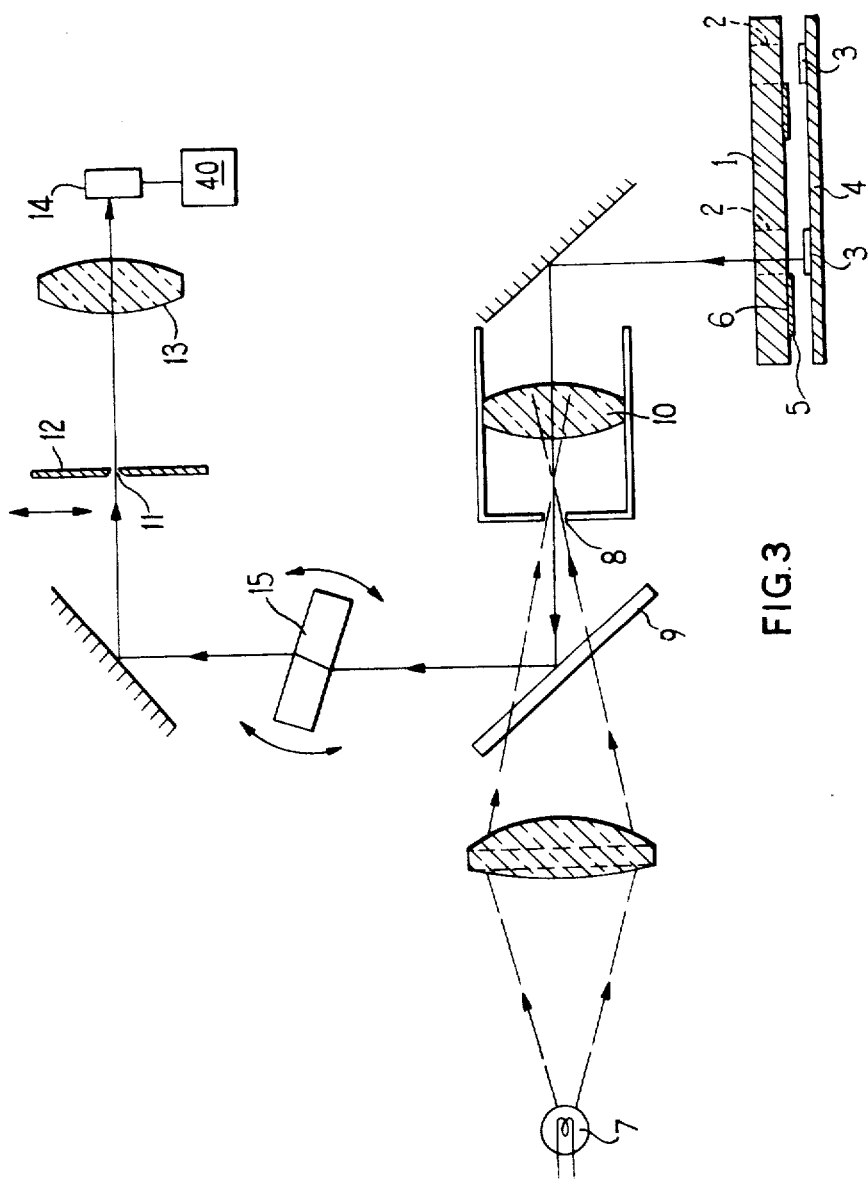
FIG. 3 illustrates part of a typical optical system used for carrying out the said first alignment method according to the invention.

The relation of the mask 1 and the wafer substrate 4 to an optical scanner such as a photo-electric microscope, during alignment of the mask and substrate, is shown in FIG. 3. Light from a source 7 is focussed on to the telecentric aperture stop 8 of the microscope. The incident beam is transmitted through a semi-reflective beam splitter 9 in which a proportion of the beam is lost by reflection, the transmitted light passing through the optical system of the microscope including an objective 10 which directs the beam through the mask on to the cruciform fiducial mark 3. Reflected light from the mark 3 returns through the microscope, is reflected by the beam splitter 9, again subject to some wastage, and is focussed to form an image 11 at a vibrating slit 12. The vibrating slit 12 oscillates in a plane perpendicular to the beam incident thereon, the slit 12 extending parallel to the image 11 of one of the lines forming the cross. The slit 12 admits light except when it coincides with the image 11, that is, at a phase of the vibration which varies with the position of the image 11 and therefore with the position of the object which in this case is the fiducial mark 3. The central position of the vibrating slit 12 constitutes a reference location. An image at this precise reference location indicates zero phase of non-admission of light and results in a zero component in the variation of a signal derived from light transmitted through the slit 12, which is directed by a field lens 13 on to a photo-sensitive element 14, preferably a phototransistor. The resulting electrical signals from the element 14 are amplified and then detected by a phase-sensitive detector 40 synchronised with the vibration of the slit 12.

In order to sense the two intersecting lines of the cross forming the fiducial mark 3 a further beam splitter (not shown) is required in the path of the image-forming reflected beam after passing through the first beam splitter 9. The two beam splitters produce two images at two separate vibrating slits which are perpendicular to each other, and which are associated with two respective photoelectric detectors. This duplication is not shown in FIG. 3, but is necessary in practice in order to produce full positional information in respect of the fiducial mark 3. A second microscope system is required for illumination and detection of the second fiducial mark 3.

An optical micrometer in the form of a parallel-sided glass plate 15 is interposed between the beam splitter 9 and the vibrating slit 12, the plate 15 being rotatable about an axis parallel to its plane faces and perpendicular to the beam to produce lateral displacement of the beam passing therethrough and of the image 11 formed thereby. Two such optical micrometers will be required in order to produce beam displacement in both X and Y directions, if independent control of movement is required for these two directions.

The manner in which the apparatus of FIG. 3 is used to achieve alignment of the mask 1 and substrate 4 will now be described, firstly considering the alignment of the marks 3 and 6 at the right hand side of FIG. 1 so that they are separated from each other by predetermined distances in the X (horizontal in FIG. 1) and Y (vertical in FIG. 1) directions.

a. The first alignment in the X direction is performed by moving the substrate 4 and coinciding one of the lines (perpendicular to the X direction) of the substrate mark 3 with the slit 12, the coincidence being detected by phase-detector 40.

b. The second alignment in the X direction is performed by first rotating glass plate 15 through a predetermined angle which produces an image displacement at slit 12 corresponding exactly to the displacement of cross 3 relative to cross 6 in the X direction when the mask and substrate are in the desired registration, and then coinciding one of the lines (perpendicular to the X direction) of the mask mark 6 with the slit 12. By these operations (a) and (b), the alignment of the mask mark located at the right hand side of FIG. 1 with the substrate mark in the X direction is completed.

c. The first alignment in the Y direction is performed by moving the substrate 4 so as to coincide the other line (perpendicular to Y direction) of the substrate mark 3 with the not-shown slit referred to above.

d. The second alignment in the Y direction is performed by first rotating another glass plate (not shown but provided corresponding to the not-shown slit referred to in (c)) by a predetermined angle corresponding to the desired Y direction displacement between the marks, and then moving the mask 1 so as to coincide the other line (perpendicular to Y direction) of the mask mark to said not-shown slit. By these operations (c) and (d), the Y direction alignment of the substrate mark with the mask mark at the right of FIG. 1 is completed.

Next, the alignment of the mask mark at the left side of FIG. 1 with the corresponding substrate mark is completed in a similar way to that explained in the above steps (a) to (d).

It will be appreciated that the interposition of the micrometer plate 15 in the reflected beam during one of the alignments effectively cancels the offset between the two sets of marks 3, 6 so that both sets of marks are aligned with the same reference location, without actual superimposition of the mask fiducial marks 6 on the substrate fiducial marks 3, which would lead to overprinting of the latter.

Another method of eliminating incident illumination upon the wafer substrate 3 is to locate the mask fiducial marks 6 outside the area of the mask covering the substrate. A suitable background is then necessary to define the marks 6.

An alternative method, avoiding the use of micrometer beam-displacing means, is to provide two separate slits at the plane of the images of the fiducial marks, defining two reference locations, spaced by a predetermined distance, for each of the two alignments.

Figure 4:
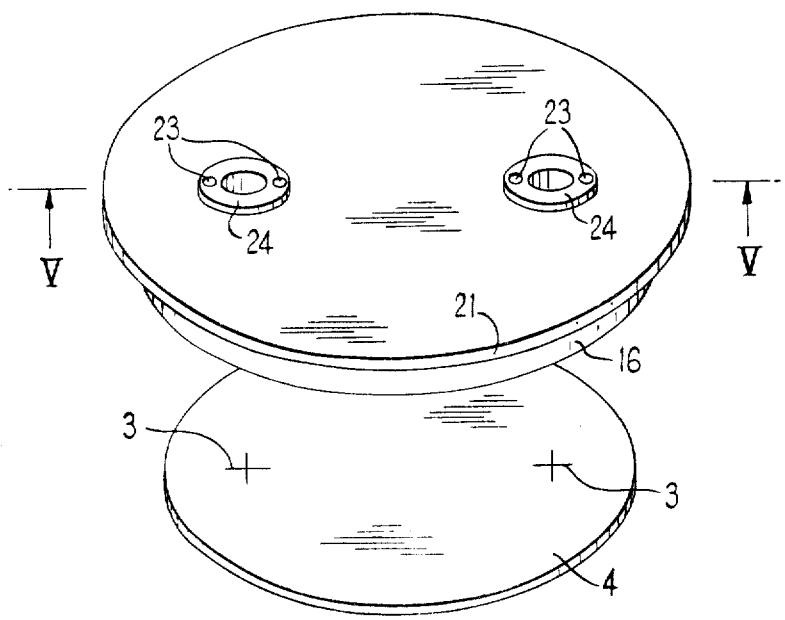
FIG. 4 is a schematic perspective view of part of apparatus employed in carrying out an alignment method according to a second embodiment of the invention.
Figure 5:
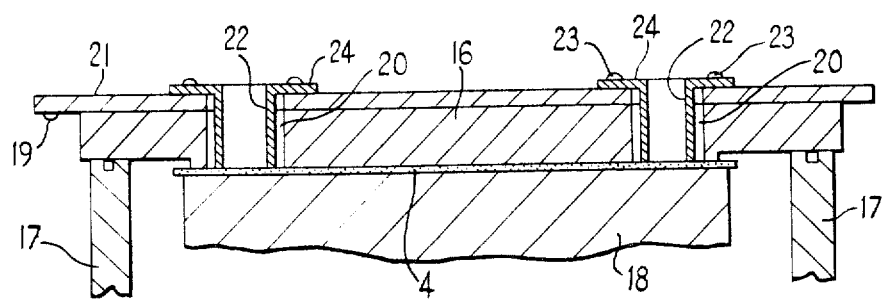
FIG. 5 is a cross-sectional view on line V—V of FIG. 4.

The embodiment of the invention described above entails the setting up of a predetermined offset between the fiducial marks of the mask and substrate, which is inconvenient and time-consuming. FIGS. 4 and 5 illustrate a preferred embodiment of the invention, which is advantageous in that it eliminates overprinting of the fiducial marks on the substrate without the need for a pecise offset between the substrate and mask marks.

In the embodiment described with reference to FIGS. 1 to 3 overprinting of the substrate fiducial marks is avoided by a physical separation of the fiducial marks of the substrate and each mask. In an alternative method according to the invention overprinting is avoided by arranging that the regions around the fiducial marks on the substrate are separately exposed before alignment with the fiducial marks on the mask, so that the latter are not photographically printed on the substrate during the main exposures of the remainder of the substrate. For example, in a preliminary approximate alignment exposure a mask may be used which admits light only to those regions of the substrate around the fiducial marks on the latter, exposing the substrate photographically in these regions only, before aligning the mask for the exposure of the remainder of the substrate. This technique would in practice be time-consuming because of the need to perform two separate mask alignments.

In the preferred embodiment illustrated in FIGS. 4 and 5 the apparatus used in transferring and/or supporting the mask and substrate for their relative alignment prior to the principal exposure of the substrate through the mask is modified to form a masking device which is used to effect the preliminary exposure of the substrate fiducial mark regions with the substrate in situ in preparation for the principal exposure.

Referring to FIGS. 4 and 5 an input wafer chuck 16 incorporates suction ports (not shown but well known) which lift a wafer substrate 4 to be printed, holding it on a flat lower surface of the chuck 16. Before lifting the substrate 4 is subjected to an initial mechanical positional adjustment to a reference position with respect to the chuck 16 so that when the latter lifts the wafer substrate 4 and moves it over a known path by the motion of a transfer arm supporting the chuck, the substrate 4 is located in a correct spatial position relative to an annular mask mounting table 17. The mask (not shown) is to be mounted on table 17 in a precisely determined way so that fiducial marks on the wafer substrate and the mask will be in correct spatial relation to permit the mask table 17 to be driven by servo-motors into exact coincidence between the corresponding fiducial marks on the substrate and the mask.

Before the mask is located on the table 17, however, the input wafer chuck 16 is lowered onto the mask table 17 and continues to hold the substrate 4 while a center chuck 18 is brought up on an air bearing (not shown) to be levelled with respect to the chuck 16 and to clamp the substrate 4 rigidly. During these operations the wafer substrate 4 is precisely located against the bottom flat surface of the wafer chuck 16 as mentioned above. This precise location is achieved by the known technique of (a) indexing the wafer substrate 4 by a kinematic probe to an exact position relative to the chuck 16 at an input station (not shown) and (b) locating the input wafer chuck 16 itself in a unique location over the input station by, for example, an interlocking three-ball/three-groove kinematic system, of which one ball 19 may be seen in FIG. 5.

Holes 20 drilled in the wafer chuck 16 are located accurately in the region of fiducial marks 3 of the wafer substrate 4 to admit light during a preliminary exposure carried out with the substrate 4 in situ while setting up the centre chuck 18. A plastics cover 21 for the input wafer chuch 16 carries the kinematic locating balls 19, and also provides an adjustment for confining the light for the preliminary exposure to the fiducial mark regions. To facilitate such adjustment the holes 20 are made larger than necessary and tubular sleeves 22 of the appropriate diameter are located in the holes 20. The sleeves 22 are adjustable in position accurately and simply by means of screws 23 tapped into the input wafer chuck cover 21 and passing through enlarged holes in flanges 24 formed on the sleeves 22. The fiducial mark regions are observed for the alignment prior to the preliminary exposure by a viewing microscope (not shown). The flanges 24 of the sleeves 22 prevent leakage of unwanted light on to the substrate 4.

After the preliminary exposure of the substrate fiducial mark regions and alignment of the substrate 4 relative to the mask table 17, centre chuck 18 is removed, the mask is placed in position and the principal exposure of the substrate 4 effected through the mask after aligning the fiducial marks on the mask and substrate in the way described in detail below.

After development, processing and re-coating the substrate is ready for a further preliminary exposure of the fiducial mark regions prior to alignment with and exposure through the next mask.

The substrate and each mask are aligned to coincidence by means of photo-electric microscopes to bring the super-imposed images of the substrate and mask fiducial marks to predetermined reference positions, for example at oscillating slits, as described previously with reference to FIGS. 1 to 3. During each principal exposure of the substrate the mask fiducial marks are not overprinted on the substrate marks because the regions of the substrate surrounding the fiducial marks on the latter have already been exposed.

The additional exposure of the substrate mark regions to avoid overprinting may be effected after the principal exposure rather than before it. For example an output wafer chuck may be designed for this purpose. Other arrangements than those described herein by way of example may be used for achieving in situ additional exposure of the substrate fiducial mark regions.

Figure 6:
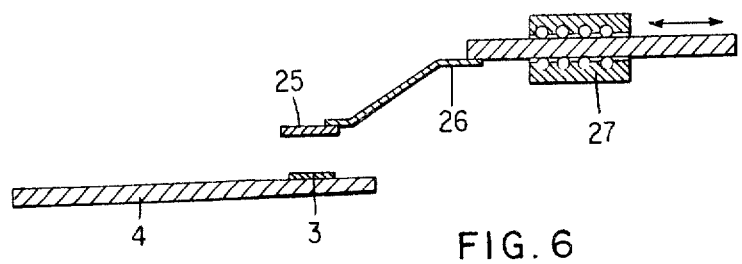
FIG. 6 is a cross-sectional view of a third embodiment of the invention.

The invention can also be used in the exposure of a positive photo-resist. For example, as shown in FIG. 6 when a positive resist has been applied to a substrate or wafer the fiducial marks on the substrate may be protected from overprinting during the principal exposure of areas of the substrate to ultra-violet light or other radiation by shielding the fiducial marks and their background areas by means of masking elements 25 carried by suitable retractable and finely adjustable supports. For this purpose the masking elements may comprise suitable small plates carried by sliding supports 26 which are preferably mounted in precision ball bushings 27 so that their movements are accurately repeatable. Each masking element in turn has an adjustable mounting on its sliding support, for example by means of an eccentric screw, enabling the position of the masking element to be adjusted with precision relative to its sliding support. During the alignment step, when the fiducial marks on the substrate are illuminated, overprinting can be avoided by interposing a filter which excludes the ultra-violet region.

We Claim:

1. Apparatus for use in positioning a succession of masks relative to a photo-sensitive substrate for the manufacture of a multi-layer structure, the substrate and each mask bearing respective fiducial marks which are utilised in such positioning, said apparatus including retractable masking elements which are movable into masking positions above the fiducial marks on the substrate to prevent exposure of the substrate in the vicinity of the said fiducial marks upon exposure of substrate.

2. Apparatus for use in positioning a succession of masks relative to a photo-sensitive substrate for the manufacture of a multi-layer structure by a series of photographic exposures, the substrate and each mask bearing respective fiducial marks which are utilized in such positioning, said apparatus comprising:
   a. means for adjusting the position of each mask relative to said substrate;
   b. first exposure means for exposing said substrate surface through each mask when said adjustment is completed; and
   c. second exposure means for exposing only the fiducial marks of the substrate and immediately surrounding regions thereof, without interposing the fiducial marks on said masks in the path of said exposure by said second means, upon but not simultaneously with each exposure of the substrate surface through each mask by said first means, so that no photographic images corresponding to the mask fiducial marks are formed on the substrate due to each said exposure by said first means.

3. The apparatus defined in claim 2, wherein said second means comprises a movable chuck device supporting the substrate for movement relative to a mask support, the chuck device having light admitting and guiding means through which only the fiducial marks and said surround regions of the substrate are exposed.

4. The apparatus defined in claim 2, wherein the light admitting and guiding means comprise respective tubular sleeves inserted in apertures in said chuck device, and means for adjusting the position of said sleeves in said chuck device for the exposure of the substrate fiducial marks and surrounding regions.

* * * * *